(12) United States Patent  
Kim et al.

(10) Patent No.: US 10,432,160 B2  
(45) Date of Patent: Oct. 1, 2019

(54) CIRCUIT ARRANGEMENT, MOBILE DEVICE AND METHOD FOR AMPLIFYING A SIGNAL

(71) Applicant: Intel IP Corporation, Santa Clara, CA (US)

(72) Inventors: Jee Hyun Kim, Unterhaching (DE); Prabin Kumar Pandey, Neubiberg (DE); Yubao Li, Beijing (CN); Gunnar Nitsche, Radebeul (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/758,736

(22) PCT Filed: Sep. 25, 2015

(86) PCT No.: PCT/CN2015/090662  
§ 371 (c)(1),  
(2) Date: Jun. 4, 2018

(87) PCT Pub. No.: WO2017/049563  
PCT Pub. Date: Mar. 30, 2017

(65) Prior Publication Data  
US 2018/0302052 A1    Oct. 18, 2018

(51) Int. Cl.  
*H03G 3/30* (2006.01)  
*H04B 1/16* (2006.01)  
(Continued)

(52) U.S. Cl.  
CPC ............ *H03G 3/3036* (2013.01); *H03F 3/19* (2013.01); *H03G 3/3052* (2013.01);  
(Continued)

(58) Field of Classification Search  
CPC .. H03G 3/3036; H03G 3/3052; H03G 3/3078; H04B 17/318; H04B 1/16; H03F 3/19  
See application file for complete search history.

(56) References Cited

U.S. PATENT DOCUMENTS

2010/0149961 A1* 6/2010 Lee .................. H04L 5/0007  
370/204  
2010/0296429 A1* 11/2010 Han .................. H04L 12/189  
370/312

FOREIGN PATENT DOCUMENTS

| CN | 201048379 Y | 4/2008 |
|---|---|---|
| EP | 1684437 A1 | 7/2006 |
| JP | 2007110643 A | 4/2007 |

OTHER PUBLICATIONS

International Search Report based on application No. PCT/CN2015/090662 (11 pages) dated Jun. 13, 2016 (Reference Purpose Only).

* cited by examiner

*Primary Examiner* — Nguyen T Vo  
(74) *Attorney, Agent, or Firm* — Viering, Jentschura & Partner MBB

(57) ABSTRACT

A circuit may include at least one amplifier circuit configured to amplify a received signal having a first signal received in a first time interval and a second signal received in a second time interval. The first signal and the second signal are signals sent by a different number of coherent wireless signal sources. The circuit arrangement may further include at least one gain control circuit connected to the at least one amplifier circuit and configured to determine a first expected received signal strength of the first signal, to determine a second expected received signal strength of the second signal, and to determine a gain level based on the first and second expected received signal strengths. The at least one amplifier circuit may be configured to amplify the first (Continued)

signal using the determined gain level and to amplify the second signal using the determined gain level.

21 Claims, 8 Drawing Sheets

(51) Int. Cl.
*H04B 17/318* (2015.01)
*H03F 3/19* (2006.01)

(52) U.S. Cl.
CPC ............. *H03G 3/3078* (2013.01); *H04B 1/16* (2013.01); *H04B 17/318* (2015.01)

CIRCUIT ARRANGEMENT, MOBILE DEVICE AND METHOD FOR AMPLIFYING A SIGNAL

RELATED APPLICATIONS

The present application is a national stage entry according to 35 U.S.C. § 371 of PCT application No.: PCT/CN2015/090662 filed on Sep. 25, 2015, which is incorporated herein by reference in its entirety.

TECHNICAL FIELD

Various aspects of this disclosure generally relate to circuit arrangements for amplifying a signal, mobile devices including a circuit arrangement for amplifying a signal and methods for amplifying a signal.

BACKGROUND

Mobile telecommunication protocols, e.g. $3^{rd}$ or $4^{th}$ generation mobile networks, e.g. Universal Mobile Telecommunications System (UMTS) or Long Term Evolution (LTE), allow multicast modes (broadcast modes) in which a signal is sent by more than one base station (NodeB or eNodeB) at the same time at the same frequency for multiple or all mobile devices (user equipments, UEs) in range. In addition to the signal from a main base station, to which a mobile device is registered, the mobile device will usually coherently receive the same signal from neighboring base stations, causing the received signal to be intensified in comparison to the signal received from the main base station. Since non-multicast modes (unicast mode) and multicast modes are applied alternatingly (in other words in a time multiplexed manner) the received signal strength accordingly varies over time even without movement of the mobile device or change in transmit power of the base station.

SUMMARY

A circuit may include at least one amplifier circuit configured to amplify a received signal having a first signal received in a first time interval and a second signal received in a second time interval. The first signal and the second signal are signals sent by a different number of coherent wireless signal sources. The circuit arrangement may further include at least one gain control circuit connected to the at least one amplifier circuit and configured to determine a first expected received signal strength of the first signal, to determine a second expected received signal strength of the second signal, and to determine a gain level based on the first and second expected received signal strengths. The at least one amplifier circuit may be configured to amplify the first signal using the determined gain level and to amplify the second signal using the determined gain level.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various aspects of this disclosure. In the following description, various aspects of this disclosure are described with reference to the following drawings, in which.

DESCRIPTION

Figure 1:
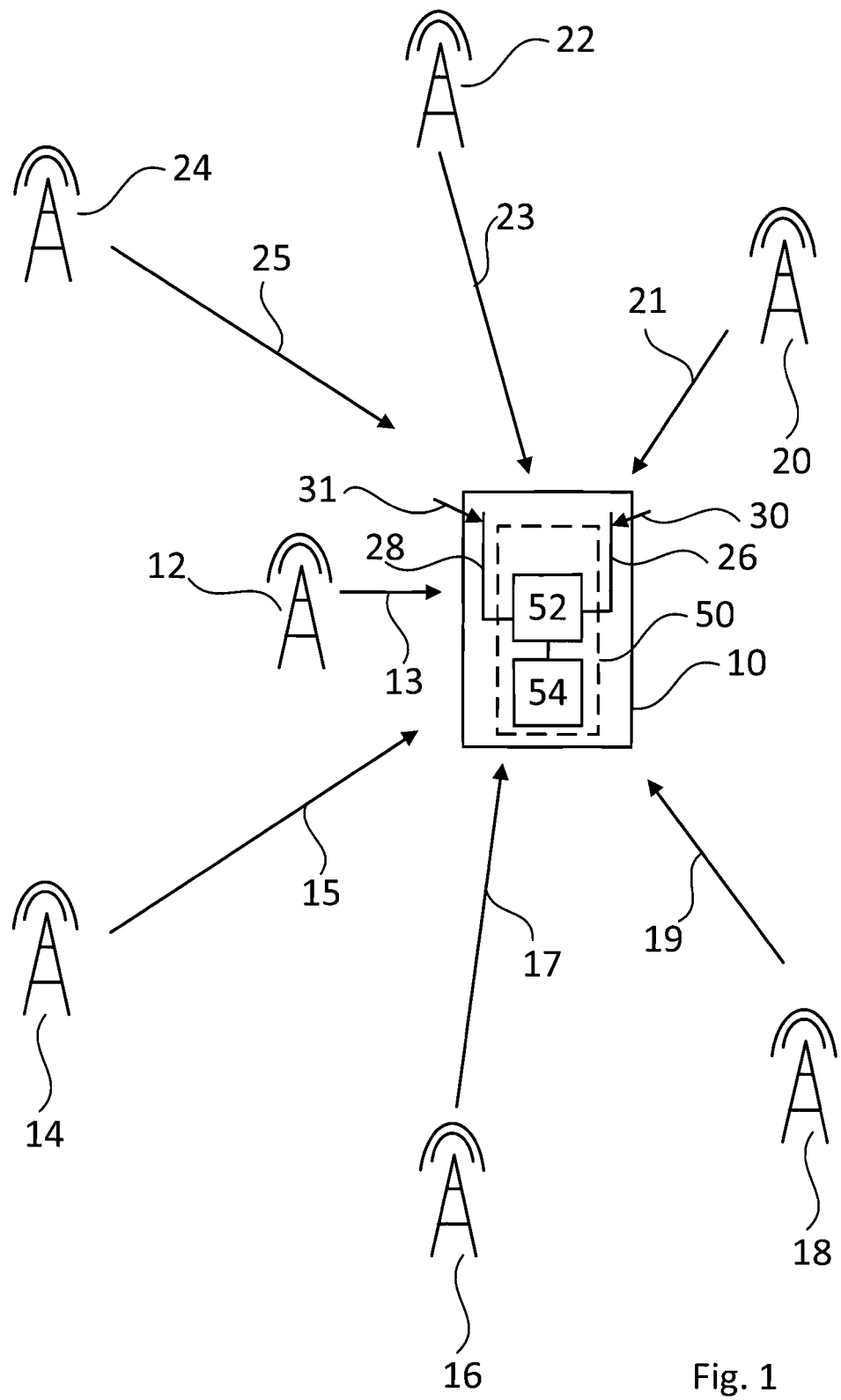
FIG. 1 shows an example of signal strength received at a mobile device for different transmission modes.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The words "plural" and "multiple" in the description and the claims, if any, are used to expressly refer to a quantity greater than one. Accordingly, any phrases explicitly invoking the aforementioned words (e.g. "a plurality of [objects]", "multiple [objects]") referring to a quantity of objects is intended to expressly refer more than one of the said objects. The terms "group", "set", "collection", "series", "sequence", "grouping", "selection", etc., and the like in the description and in the claims, if any, are used to refer to a quantity equal to or greater than one, i.e. one or more. Accordingly, the phrases "a group of [objects]", "a set of [objects]", "a collection of [objects]", "a series of [objects]", "a sequence of [objects]", "a grouping of [objects]", "a selection of [objects]", "[object] group", "[object] set", "[object] collection", "[object] series", "[object] sequence", "[object] grouping", "[object] selection", etc., used herein in relation to a quantity of objects is intended to refer to a quantity of one or more of said objects. It is appreciated that unless directly referred to with an explicitly stated plural quantity (e.g. "two [objects]" "three of the [objects]", "ten or more [objects]", "at least four [objects]", etc.) or express use of the words "plural", "multiple", or similar phrases, references to quantities of objects are intended to refer to one or more of said objects.

As used herein, a "circuit" may be understood as any kind of logic (analog or digital) implementing entity, which may be special purpose circuitry or a processor executing software stored in a memory, firmware, hardware, or any combination thereof. Furthermore, a "circuit" may be a hard-wired logic circuit or a programmable logic circuit such as a programmable processor, for example a microprocessor (for example a Complex Instruction Set Computer (CISC) processor or a Reduced Instruction Set Computer (RISC) processor). A "circuit" may also be a processor executing software, for example any kind of computer program, for example a computer program using a virtual machine code such as for example Java. Any other kind of implementation of the respective functions which will be described in more detail below may also be understood as a "circuit". It is understood that any two (or more) of the described circuits may be combined into a single circuit with substantially equivalent functionality, and conversely that any single described circuit may be distributed into two (or more) separate circuits with substantially equivalent functionality.

As used herein, "memory" may be understood as an electrical component in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, etc. Furthermore, it is appreciated that shift registers, processor registers, data buffers, etc., are also embraced herein by the "term" memory. It is appreciated that a single component referred to as "memory" or "a memory" may be composed of more than one different type of memory, and thus may refer to a collective component including one or more types of memory. It is readily understood that any single memory "component" may be distributed or/separated multiple substantially equivalent memory components, and vice versa. Furthermore, it is appreciated that while "memory" may be depicted, such as in the drawings, as separate from one or more other components, it is understood that memory may be integrated within another component, such as on a common integrated chip.

The term "base station" used in reference to an access point of a mobile communication network may be understood as a macro base station, micro base station, Node B, evolved NodeBs (eNB), Home eNodeB, Remote Radio Head (RRHs), relay point, etc.

As used herein, a "cell" in the context of telecommunications may be understood as a sector served by a base station. Accordingly, a cell may be a set of geographically co-located antennas that correspond to a particular sectorization of a base station. A base station may thus serve one or more "cells" (or sectors), where each cell is characterized by a distinct communication channel. Furthermore, the term "cell" may be utilized to refer to any of a macrocell, microcell, femtocell, picocell, etc.

It is appreciated that the ensuing description may detail exemplary scenarios involving mobile device operating according to certain 3GPP (Third Generation Partnership Project) specifications, notably Long Term Evolution (LTE) and Long Term Evolution-Advanced (LTE-A). It is understood that such exemplary scenarios are demonstrative in nature, and accordingly may be similarly applied to other mobile communication technologies and standards. The examples provided herein are thus understood as being applicable to various other mobile communication technologies, both existing and not yet formulated, particularly in cases where such mobile communication technologies share similar features as disclosed regarding the following examples.

A communication according to the mobile communication technology may be organized into frames. Each frame may be organized into subframes. Each frame may be equally divided into these subframes. The subframes may be used for different transmission modes (transmission types, transmission protocol). A frame of a signal sent by a base station may include header information informing the mobile device about the structure of the subframes, e.g. the header information may inform the mobile device, which subframes are using which transmission mode and/or which subframes the mobile device should listen to.

The term "multicast transmission mode" may refer to a transmission mode in which multiple neighboring base stations are time-synchronized to each other and are sending the same signal (the same information, the same frequency, the same encoding) at the same time. The signal may be intended to be received and decoded by more than one mobile device. The signal may be intended to be received and decoded by all mobile devices that are configured to understand the transmission. The multicast transmission mode may be mobile television mode. The multicast transmission mode may be a multimedia streaming mode. The multicast transmission mode may be a PMCH encoded transmission mode.

The term "unicast transmission mode" may refer to a transmission mode in which the signals sent by a main base station and neighboring base station is different. The signal sent by the main base station during the unicast transmission mode may be intended to only be decoded by a single mobile device. The unicast transmission mode may refer to a communication of a single base station with a single mobile device.

FIG. 1 shows a mobile device 10, a main base station 12 and six neighboring base stations 14, 16, 18, 20, 22, 24. The mobile device 10 may be a mobile telecommunication device, e.g. a mobile phone, e.g. a smartphone, a tablet PC and the like. The mobile device 10 is located nearest to the main base station 12 of the base stations 12, 14, 16, 18, 20, 22, 24. The mobile device 10 includes a first antenna 26, at least for receiving a signal 30 sent by the base stations 12, 14, 16, 18, 20, 22, 24. The first antenna 26 may also be configured to send signals from the mobile device 10 to the base stations 12, 14, 16, 18, 20, 22, 24. The mobile device 10 may include at least one second antenna 28 at least for receiving a signal 31 sent by base stations 12, 14, 16, 18, 20, 22, 24. The second antenna 28 may be arranged distanced from the first antenna 26. The mobile device 10 may be configured to improve the received signal 30 on basis of time differences (delay times, time delays) between the signal 30 received at the first antenna 26 and the signal 31 received at the second antenna 28.

The mobile device 10 is registered to the main base station 12. The main base station 12 may be the nearest base station. The main base station 12 may be the base station providing the highest signal strength to the mobile device 10. The signal 30 (also see FIG. 2) received by the mobile device is a superposition of signals 13, 15, 17, 19, 21, 23, 25 sent by all the base stations 12, 14, 16, 18, 20, 22, 24 in reach of the mobile device.

Figure 2:
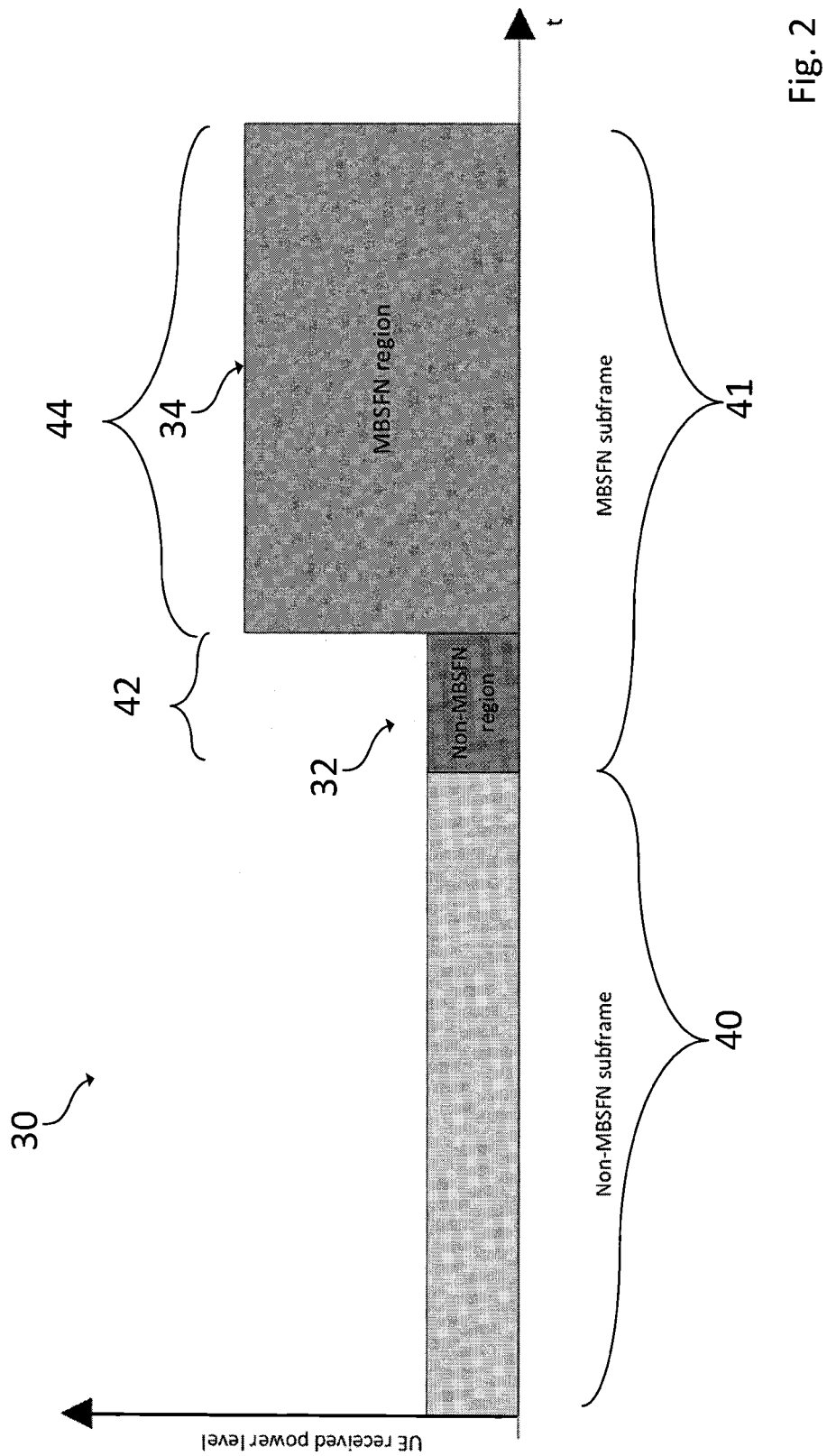
FIG. 2 shows an example of signal strength received at a mobile device for different transmission modes.

FIG. 2 shows the signal strength of a signal 30 received at the mobile device 10. The signal 30 includes a first subframe 40 and a second subframe 41. The subframes 40, 41 may be subframes according to a wireless communication technology. The wireless communication technology may be a wireless communication technology according to 3rd Generation Partnership Program or Long Term Evolution.

During the first subframe 40 the signals 13, 15, 17, 19, 21, 23, 25 sent by the base stations 12, 14, 16, 18, 20, 22, 24 are uncorrelated and therefore the signal 13 sent by the main base station 12 dominates the signal 30. The interfering signals 15, 17, 19, 21, 23, 25 of the neighboring base stations 14, 16, 18, 20, 22, 24 mostly cause destructive interference with each other and therefor do not add significantly to the signal strength of signal 30. Further additional interference avoidance mechanism may be in place for the first subframe (unicast transmission), as the signal 30 during the first subframe may be intended specifically for the mobile device 10 and it may be designed not to create so much interference (e.g. between mobile devices and/or base stations) by standard in most cases.

The second subframe 41 includes a first time interval 42 (first partial subframe) and a second time interval 44 (second partial subframe). The second time interval immediately follows the first time interval (i.e. there may be no additional time interval between the first time interval and the second time interval). The signal 30 includes a first signal 32 received during the first time interval 42 and includes a second signal 34 received during the second time interval 44.

During the first time interval 42, the base stations 12, 14, 16, 18, 20, 22, 24 send the signals 13, 15, 17, 19, 21, 23, 25 which are uncorrelated and therefore, the signal 13 sent by the main base station 12 dominates the first signal 32. Therefore, only one (e.g. exactly one) single coherent signal source (main base station 12) sends the first signal 32. Thus, there is only one coherent signal source (base station). The interfering signals 15, 17, 19, 21, 23, 25 of the neighboring base stations 14, 16, 18, 20, 22, 24 may cause destructive interference with each other and therefore may not add significantly to the signal strength of the first signal 32.

During the second time interval 44 the base stations 12, 14, 16, 18, 20, 22, 24 send the same (type of) signals 13, 15, 17, 19, 21, 23, 25 and only differ by different time delays due to different distances between the respective receiving antenna and the respective base station 12, 14, 16, 18, 20, 22, 24 when received by the mobile device 10. The second signal 34 therefore is sent by seven coherent signal sources (base stations 12, 14, 16, 18, 20, 22, 24). Therefore, the signal 13 sent by the main base station 12 is intensified by the interfering signals 15, 17, 19, 21, 23, 25 of the neighboring base stations 14, 16, 18, 20, 22, 24 and therefore is significantly higher in comparison to the first time interval 42. The signal strength of the second signal 34 may be by at least 40% (e.g. 1.5 dB), by at least 100% (e.g. 3 dB), by at least 300% (e.g. 6 dB) or by at least 600% higher (e.g. 9 dB difference) than the signal strength of the first signal 32.

This should only be an example. In further situations it is possible that only some (or only one) of the neighboring base stations 14, 16, 18, 20, 22, 24 are transmitting the same signal during the second time interval as the main base station 12. Furthermore in alternative embodiments, the second subframe may include more than two partial subframes. Furthermore in alternative embodiments the second signal may be received by the mobile device 10 (and sent by the respective main station) immediately before the first signal.

FIG. 1 further shows a circuit arrangement 50 included by the mobile device 10. The circuit arrangement 50 is connected to the first antenna 26. The circuit arrangement 50 includes an amplifier circuit 52 (RFIC) configured to amplify the received signal 30, and one gain control circuit 54 connected to the at least one amplifier circuit 52. The circuit arrangement 50 may be connected to the second antenna 28. The circuit arrangement 50 may include a correction circuit. The correction circuit may be connected between the first and second antennas 26, 28 and the amplifier circuit 52. The amplifier circuit 52 may be configured to amplify the signals for both antennas separately. The amplifier control circuit may be configured to set the gain level independently for each antenna 26, 28.

The gain control circuit 54 is configured to determine a first expected received signal strength of the first signal 32, to determine a second expected received signal strength of the second signal 34 and to determine a gain level based on the first and second expected received signal strengths. The amplifier circuit 52 is configured to amplify the first signal 32 using the determined gain level and to amplify the second signal 34 using the same determined gain level. The gain control circuit 54 may be configured to determine the gain level before the first signal 32 and the second signal 34 are amplified by the amplifier circuit 52. The gain control circuit 54 may be configured to set the gain level of the amplifier unit at the beginning of the earlier of the first and second time interval 32, 34. The gain control circuit 54 may be configured to determine the gain level at least 0.1 ms before, e.g. 0.3 ms before, the gain control circuit 54 sets the gain level of the amplifier circuit 52.

Using the same gain level despite differences in signal strength for the first and second time intervals 42, 44 may improve the spur estimation, and/or channel estimation operations (delay spread, time offset, frequency offset), since phase jumps in the received signal, as they happen during gain level updates (analog gain changes), are prevented. During the first time interval 42 a high redundancy modulation scheme (e.g. phase-shift keying or quadrature phase-shift keying) may be used, which may allow a correct signal decoding also with low amplified signal strength.

The second signal 44 may be generated according to a multicast transmission mode and the first signal 42 is generated according to a unicast transmission mode. Furthermore, the first signal may be generated according to a multicast transmission mode and the second signal is generated according to a unicast transmission mode.

The first time interval 42 may have a length of 50% or less of the length of the second time interval 44. In alternative embodiments, the second time interval may have a length of 50% or less of the length of the first time interval.

The first time interval 42 may have a length of 20% of the length of the second time interval 44, the first signal 32 being generated by a unicast transmission mode and the second signal 34 being generated by a multicast transmission mode. The second subframe 41 may have a length of 1 ms.

For example, spur estimation requires a minimum measurement time of the signal since the last gain update to allow for a reliable spur cancellation. Therefore, the prevention of gain updates after short time intervals may be desired.

The second subframe 41 may be a Multicast-Broadcast Single Frequency Network subframe. The subframe may be a subframe according to a Multimedia Broadcast Multicast Service.

Determining the gain level may include determining a first candidate gain level for the first time interval, determining a second candidate gain level for the second time interval and setting the gain level to the smaller of the first and second candidate gain levels. This may prevent the amplifier circuit 52 or circuitry connected to the amplifier circuit, especially a decoder circuit and/or a controller of the mobile device 10 from clipping, oversteering and/or damage.

Figure 3:
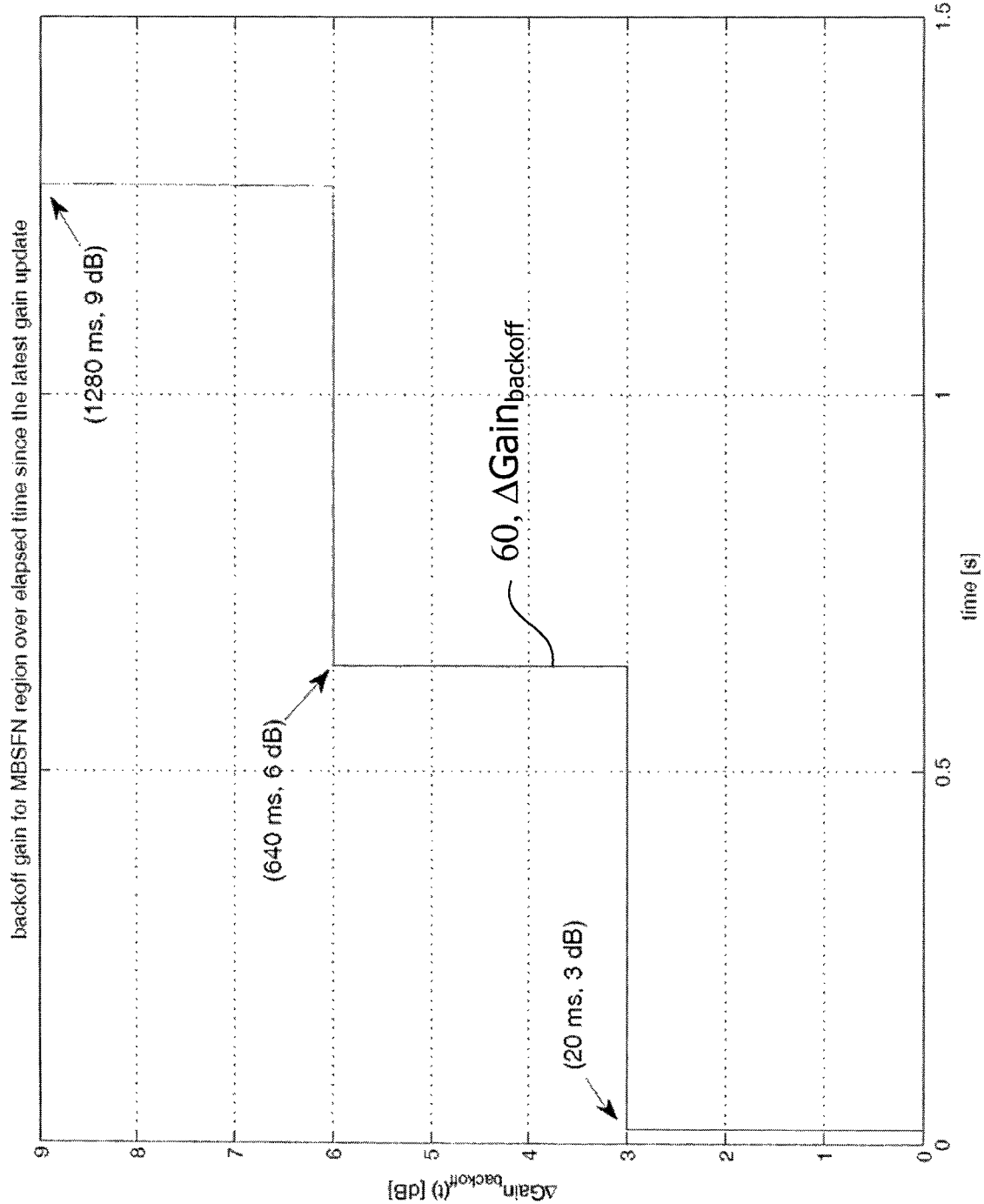
FIG. 3 shows a function for determining a backoff gain.

One of the transmission modes, used to generate the first and second signal respectively might be used more frequently than the other. The transmission mode used to generate the first signal 32 (e.g. the unicast mode) may be used more frequently than the transmission mode to generate the second signal 34 (e.g. the multicast mode). Accordingly the determining of at least the second candidate gain level includes a subtraction of a backoff gain $\Delta Gain_{backoff}$. The backoff gain $\Delta Gain_{backoff}$ being determined according to a step function 60 of time elapsed since the last time the same respective transmission mode, as is being used in the second time interval 44, was in effect (also see FIG. 3). The step function 60 increases over time and has a lower limit of zero and is limited to a maximum backoff. The step function may be a monotonically increasing function. The maximum backoff may be 9 dB. For time elapsed less than 20 ms, the step function 60 may have a value of zero. For times elapsed of at least 20 ms and less than 640 ms, the step function 60 may have a value of 3 dB. For times elapsed of at least 640 ms and less than 1280 ms, the step function 60 may have a value of 6 dB. For times elapsed of at least 1280 ms, the step function 60 may have a value of 9 dB. Different step functions may be suitable. Furthermore, the backoff gain may be determined according to any suitable function of time elapsed since the last time the same respective transmission mode, as is being used in the second time interval 44, was in effect. The function may be a monotonically increasing function. The function may be a strictly increasing function. The function may have an upper limit of the maximum backoff. The function may have a lower limit higher or equal to zero. Including a backoff gain in the determination of the (second) candidate gain may help to take uncertainties such as changed receiving conditions (e.g. changed location of the mobile device), which might lead to a higher signal strength compared to the last time the same transmission mode was used as is used in the second time interval, into account and may prevent clipping, oversteering or damage to the circuitry.

The determining of the second candidate gain level may include the limitation to result in a value higher or equal to the first candidate gain level reduced by a fixed value. The determining of the gain level may include the limitation to result in a value higher or equal to the higher of the first and second candidate gain levels reduced by a fixed value. The fixed value may be a gain difference as it could theoretically occur between the transmission modes of the first signal 32 (e.g. a unicast mode) and the second signal 34 (e.g. a multicast mode). The fixed value may be a value in the range from about 3 dB to about 15 dB. The fixed value may be a value in the range from about 6 dB to about 12 dB. The fixed value may be about 9 dB. The fixed value may be about 12 dB. In alternative embodiments the fixed value may a negative value. The fixed value may be chosen in dependence of the difference of coherent signal sources between the first and second signal 32, 34. The fixed value may be chosen according to geographic information, e.g. the base station density in the area of the mobile device. This may allow a better received signal accuracy, especially since applying an unnecessarily high backoff gain may be prevented.

The gain control circuit 54 may be configured to determine gain reference values for different transmission modes during time intervals in which the respective transmission mode is in effect and save these gain reference values together with a time stamp. The gain control circuit 54 may include a measuring circuit configured to measure a signal strength (RSSI Value) of the signal 30 and/or of an amplified signal outputted by the amplifier circuit 52 on basis of signal 30. The gain control circuit 50 may include a memory circuit for saving the gain reference values. The gain reference values for a transmission mode may include at least one of the signal strength of the received signal, the signal strength of the amplified signal during the time interval. The gain reference values may include the gain level applied during the respective time interval. The gain reference values may include a suggested gain level. The suggested gain level may be a gain level, using which the amplifier circuit would have amplified the received signal to a set preferred signal strength. The suggested gain level may be a gain level used during the time interval, increased by a set difference value, e.g. 3 dB, if the measured signal strength of the amplified signal during the time interval is below a set lower threshold. The suggested gain level may be a gain level used during the time interval, decreased by a set difference gain level, e.g. 3 dB, if the measured signal strength of the amplified signal during the time interval is above a set upper threshold. The suggested gain level may be a gain level used during the time interval, if the measured signal strength of the amplified signal during the time interval is in the range of the lower to the upper threshold.

The first and the second time intervals may be part of a same Multicast-Broadcast Single Frequency Network subframe 41 according to a wireless transmission protocol. The gain control circuit 54 may be configured to save gain reference values for each encountered Multicast-Broadcast Single Frequency Network region separately. By way of example, the mobile device may be located in at least two, and e.g. up to eight, different Multicast-Broadcast Single Frequency Network regions at the same time. Each Multicast-Broadcast Single Frequency Network region may use a different set of base stations for the multicast time interval (e.g. the second time interval), which may result in different signal strength between the multicast transmission modes of different regions, e.g. due to different numbers of coherent signal sources. Furthermore, gain reference values may be saved for all (e.g. both) antennas 26, 28 separately.

The first signal 32 may be sent according to a first transmission mode (e.g. the unicast transmission mode) and the second signal 34 is sent according to a second transmission mode (e.g. the multicast transmission mode). Determining the gain level may include determining a first candidate gain level for the first time interval on basis of the saved reference value for the first transmission mode, determining a second candidate gain level for the second time interval on basis of the saved reference values for the second transmission mode and setting the gain level to the smaller of the first and second candidate gain level.

Figure 4:
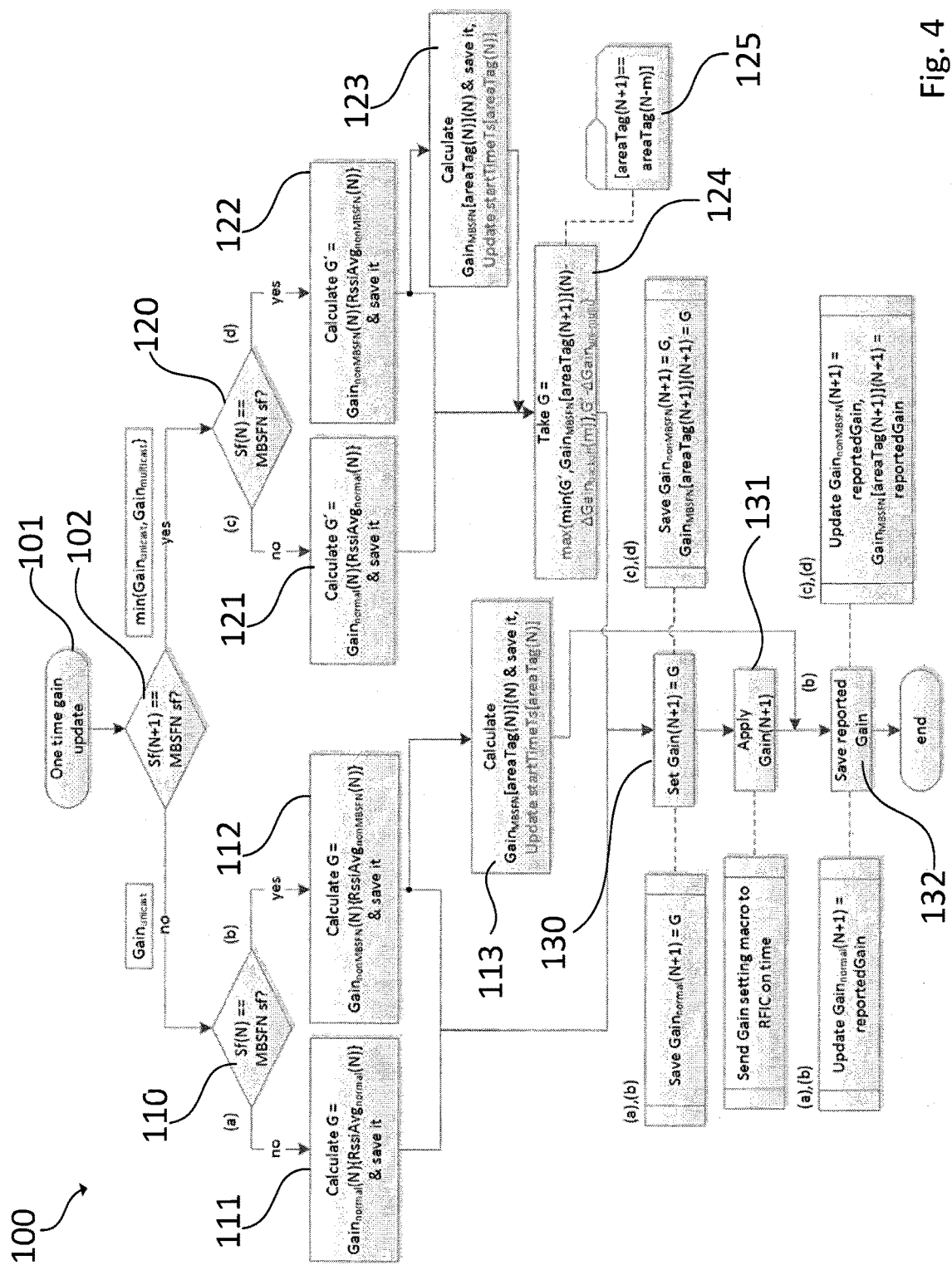
FIG. 4 shows a flow diagram of method for determining a gain level.

FIG. 4 shows a method 100 for updating the gain level of the amplifier circuit 52. Method 100 may include a selection of processes 101, 102, 110, 111, 112, 113, 120, 121, 122, 123, 124, 130, 131, 132, 133.

In 101, during a current subframe 202 (subframe N), before a next subframe 200 (subframe "N+1") the method 100 is initialized. The method 100 proceeds to 102. 101 may be executed 0.3 milliseconds before the start of the next subframe 200. 101 may be executed after signal strength measurements 210, 211, 212 (RSSI calculation) for the current subframe 202 are concluded. Signal strength measurements 210, 211, 212 for the current subframe 202 may be concluded before 101 is executed.

In 102 it is checked if the next subframe 200 is a subframe including a multicast time interval 204 (second time interval) and a unicast time interval 205 (first time interval). If in 102 it is determined, that the next subframe 200 does not include a multicast time interval 204 and a unicast time interval 205, the method 100 proceeds with 110. If in 102 it is determined, that the next subframe 200 does include a multicast time interval 204 and a unicast time interval 205, the method 100 proceeds with 120.

In 110 it is checked, if the current subframe 202 does include a multicast time interval 206 and a unicast time interval 207. If in 110 it is determined, that the current subframe 202 does not include a multicast time interval 206 and a unicast time interval 207, the method proceeds with 111 (see also FIG. 5A). If in 110 it is determined, that the current subframe 202 does include a multicast time interval 206 and a unicast time interval 207, the method proceeds with 112 (see also FIG. 5B).

In 111 a gain level G is determined on basis of the current gain level G(N) (Gain$_{normal}$(N)) and the result of the signal strength measurements 210 of the current subframe 202 (RssiAvg$_{normal}$(N)). After 111, method 100 proceeds with 130.

In 112 a gain level G is determined on basis of the current gain level G(N) (Gain$_{nonMBSFN}$) and the result of the signal strength measurements 211 (RssiAvg$_{nonMBSFN}$(N)) of the current subframe's 202 unicast time interval 207. After 112, method 100 proceeds with 113. Further, 130 follows on 112. 130 may be executed before 113 is concluded or executed.

In 113, a gain reference value Gain$_{MBSFN}$ is determined on basis of the current gain level G(N) (Gain$_{MBSFN}$) and the result of the signal strength measurements 212 (RssiAvg$_{MBSFN}$(N)) of the current subframe's 202 multicast time interval 206. The gain reference value may be a suggested gain level Gain$_{MBSFN}$. Further, in 113 it may be determined to which multicast region areaTag(N) the current subframes 202 multicast time interval 206 belongs. Further, in 113, the gain reference value Gain$_{MBSFN}$ and a time stamp startTimeTs(N) may be saved. These may be saved in a reference table 125 under the reference of the determined multicast region areaTag(N). The time stamp startTimeTs(N) may be one or more of: the current time, a value of a (continuously counting) subframe counter, the time of the RSSI measurement or the time of the start or end of the current subframe 202.

In 120 it is checked, if the current subframe 202 includes a multicast time interval 206 and a unicast time interval 207. If in 110 it is determined, that the current subframe 202 does not include a multicast time interval 206 and a unicast time interval 207, the method proceeds with 121 (see also FIG. 5A). If in 120 it is determined, that the current subframe 202 includes a multicast time interval 206 and a unicast time interval 207, the method proceeds with 122 (see also FIG. 5B).

In 121, a first candidate gain level G' is determined (for the first time interval 207 of the next subframe 200) on basis of the current gain level G(N) (Gain$_{normal}$(N)) and the result of the signal strength measurements 210 of the current subframe 202 (RssiAvg$_{normal}$(N)). After 121, method 100 proceeds with 124.

In 122, a first candidate gain level G' is determined on basis of the current gain level G(N) (Gain$_{nonMBSFN}$) and the result of the signal strength measurements 211 (RssiAvg$_{nonMBSFN}$(N)) of the current subframe's 202 unicast time interval 207. After 122, method 100 proceeds with 123. Further, 124 follows on 122. 123 may (should) be concluded before 124 is executed.

In 123, a gain reference value Gain$_{MBSFN}$ is determined on basis of the current gain level G(N) (Gain$_{MBSFN}$) and the result of the signal strength measurements 212 (RssiAvg$_{MBSFN}$(N)) of the current subframe's 202 multicast time interval 206. The gain reference value may be a suggested gain level Gain$_{MBSFN}$. Further, in 123, it is determined to which multicast region areaTag(N) the current subframes 202 multicast time interval 206 belongs. Further, in 123, the gain reference value Gain$_{MBSFN}$ and the current time (Ts) are stored. They may be stored in reference table 125 under the reference of the determined multicast region areaTag(N).

In 124, the multicast region areaTag(N+1) of the multicast time interval 206 of the next subframe 200 is determined. Further, in 124, a second candidate gain level is determined based on the gain reference value Gain$_{MBSFN}$ stored under the reference of the determined multicast region areaTag(N+1) in the reference table 125. To determine the second candidate gain level, the reference value Gain$_{MBSFN}$ is reduced by a backoff gain ΔGain$_{backoff}$(m) in dependence of time elapsed (t) since the time stamp saved reference of the determined multicast region areaTag(N+1). The time elapsed (t) may hereby be interpreted as the number (m) of subframes elapsed since the saved time stamp startTimeTs.

In 124, the gain level G is determined. The determining of the gain level G may include the limitation to result in a value higher or equal to first candidate gain level G' reduced by a fixed value ΔGain$_{uni-multi}$. The fixed value ΔGain$_{uni-multi}$ may be 9 dB. The gain level G is determined to be the minimum of the first and second candidate gain levels (G' and Gain$_{MBSFN}$−ΔGain$_{backoff}$(m)) if this minimum is larger than the first candidate gain level G' reduced by the fixed value, or to be the first candidate gain level G' reduced by the fixed value ΔGain$_{uni-multi}$, if the minimum is smaller than or equal to the first candidate gain level G' reduced by the fixed value ΔGain$_{uni-multi}$. The determining of the gain level G may therefore be determined as:

$$G=\max\{\min\{G', \text{Gain}_{MBSFN}[\text{areaTag}(N+1)]-\Delta\text{Gain}_{backoff}(m)\}, G'-\Delta\text{Gain}_{uni-multi}\} \qquad (1)$$

In 111, 112, 113, 121, 122, 123 the gain level G, respectively the gain reference value Gain$_{MBSFN}$, respectively the first candidate gain level G' may be determined to be the current gain level G(N) increased by a difference gain, if the respective signal strength measurement 210, 211, 212 results in a value below a lower threshold. The gain level G, respectively the gain reference value Gain$_{MBSFN}$, respectively the first candidate gain level G' may be determined to be the current gain level G(N) decreased by a difference gain, if the respective signal strength measurement 210, 211, 212 results in a value above an upper threshold. The gain level G, respectively the gain reference value Gain$_{MBSFN}$, respectively the first candidate gain level G' may be determined to be the current gain level G(N), if the respective signal strength measurement 210, 211, 212 results in a value in the range between the lower threshold and the upper threshold (target headroom, e.g. around −18 dB e.g. for frequency domain or e.g. around −21 dB e.g. for time domain).

The difference gain may have a value of 3 dB. The gain level G, respectively the gain reference value Gain$_{MBSFN}$, respectively the first candidate gain level G' may be the sum of G(N) and one of −3 dB; 0 dB; 3 dB. Moreover, the difference gain may have a value of 3 dB, 6 dB, or 9 dB, which may allow for a quick adaptation to a new situation. The gain level G, respectively the gain reference value Gain$_{MBSFN}$, respectively the first candidate gain level G' may be the sum of G(N) and one of −9 dB, −6 dB, −3 dB; 0 dB; 3 dB, 6 dB, 9 dB. The difference gain may take any value suitable. The difference gain level may be calculated to fulfil the condition that a strength of the amplified signal would have been within a target range.

In 130 the gain level G(N+1) for the subframe 200 may be set to the determined gain level G. After the gain level G is determined in 111 or 112, it may be stored as gain reference value Gain$_{normal}$(N+1). The gain reference value Gain$_{normal}$(N+1) may be stored in the reference table 125 without a region reference. After the gain level G is determined in 124, the gain level G may be saved as gain reference value Gain$_{nonMBSFN}$(N+1). The gain reference value Gain$_{nonMBSFN}$(N+1) may be saved in the reference table 125 without a region reference. After the gain level G is determined in 124, the gain level G may be saved as Gain$_{MBSFN}$(N+1) under the reference of the next subframe's 200 determined multicast region areaTag(N+1) (together with the current time tag). The current gain G(N) as in 111, 112, 121, 122 may be determined from the reference table 125. Method 100 proceeds with 131.

In 131 the gain level G (gain level G(N+1)) may be applied at the time of the start of the next subframe 200. Method 100 may proceed with 132.

In 132, it may be determined which gain level is reported (by the amplifying circuit 52) after 131. The determined gain level G and reported gain level may differ in cases in which physical limits of the amplifier circuit 52 are reached or in which errors occurred. The values stored in 130 may be updated with the reported gain level. Moreover, the determined gain level may not be saved during step 130, but may be stored in the reference table after the determined gain level was updated by the reported gain level.

Method 100 may end after 132 in 134.

Method 100 may be executed by the gain control circuit 54. In 131, the gain control circuit may be configured to send a signal (Gain setting macro) to the amplifier circuit 52 for updating the gain setting of the amplifier circuit 52 shortly before the start of the next subframe 200, so the amplifier circuit 52 may have the new gain level set at the beginning of the next subframe 200. The reference table 125 may be stored in a memory circuit of the gain control circuit 54.

FIGS. 5A, 5B, 5C, 5D each show the method 100 applied based on different situations in which a current subframe 202 is followed by a next subframe 200.

Figure 5A:
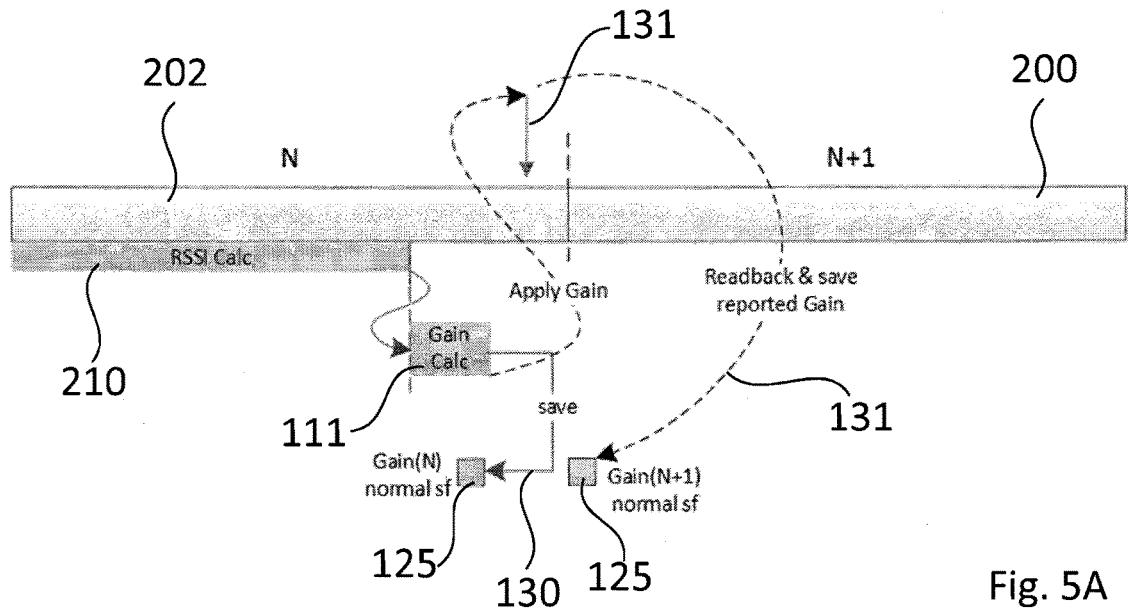
FIGS. 5A to 5D show different situations in which the method according to FIG. 4 is applied.

FIG. 5A shows a situation in which a normal subframe (current subframe 202) is followed by a normal subframe (next subframe 200).

Figure 5B:
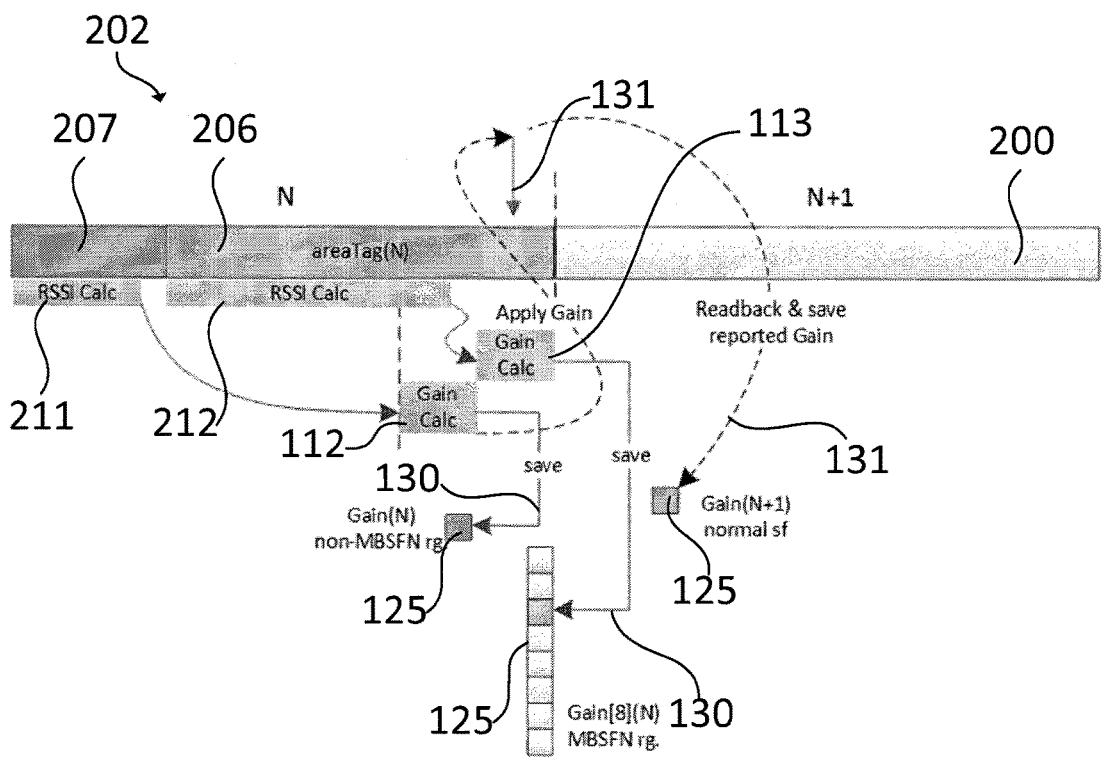

FIG. 5B shows a situation in which a Multicast-Broadcast Single Frequency Network subframe (current subframe 202) is followed by a normal subframe (next subframe 200). The current subframe 202 hereby is included of a first time interval 207 (unicast time interval, first partial subframe) and a second time interval 206 (multicast time interval, second partial subframe).

Figure 5C:
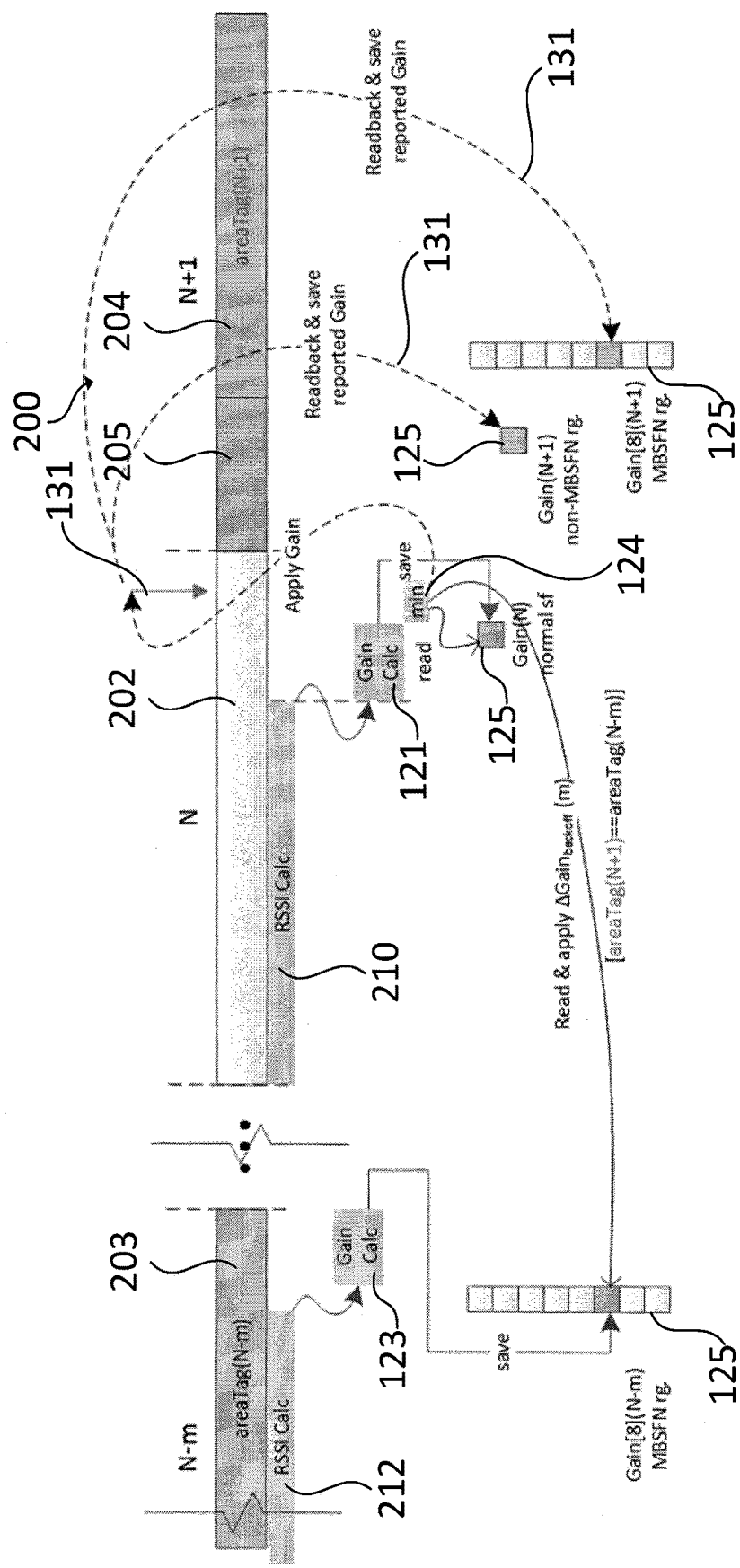

FIG. 5C shows a situation in which a normal subframe (current subframe 202) is followed by a Multicast-Broadcast Single Frequency Network subframe (next subframe 200). The next subframe 202 hereby is formed of a first time interval 205 (unicast time interval, first partial subframe) and a second time interval 204 (multicast time interval, second partial subframe).

Figure 5D:
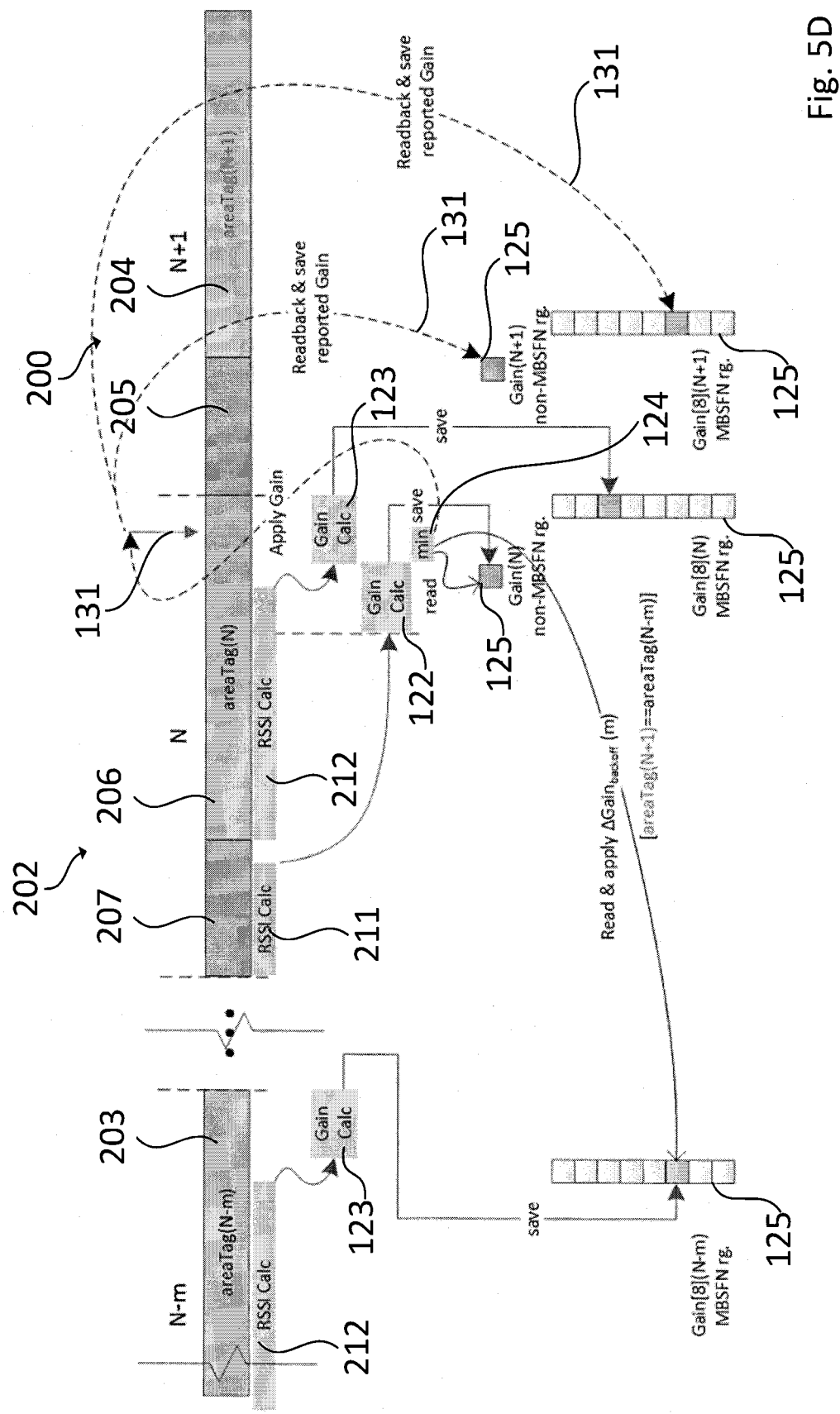

FIG. 5D shows a situation in which a Multicast-Broadcast Single Frequency Network subframe (current subframe 202) is followed by a Multicast-Broadcast Single Frequency Network subframe (next subframe 200). The next subframe 200 is part of a different multicast region than the current subframe 202. The current subframe 202 may be formed of a first time interval 207 (unicast time interval, first partial subframe) and a second time interval 206 (multicast time interval, second partial subframe). The next subframe 202 may be formed of a first time interval 205 (unicast time interval, first partial subframe) and a second time interval 204 (multicast time interval, second partial subframe).

FIG. 5C and FIG. 5D respectively show a part of a Multicast-Broadcast Single Frequency Network subframe 203 (previous subframe) that was part of the same multicast region (areaTag) as the next subframe 200 is.

In a further situation the current subframe 202 and the next subframe 200 may both be Multicast-Broadcast Single Frequency Network subframes of the same region. In such a situation the previous subframe 203 would not be needed to execute the method 100.

In FIGS. 5A to 5D the processes of method 100 are marked where appropriate.

Figure 6:
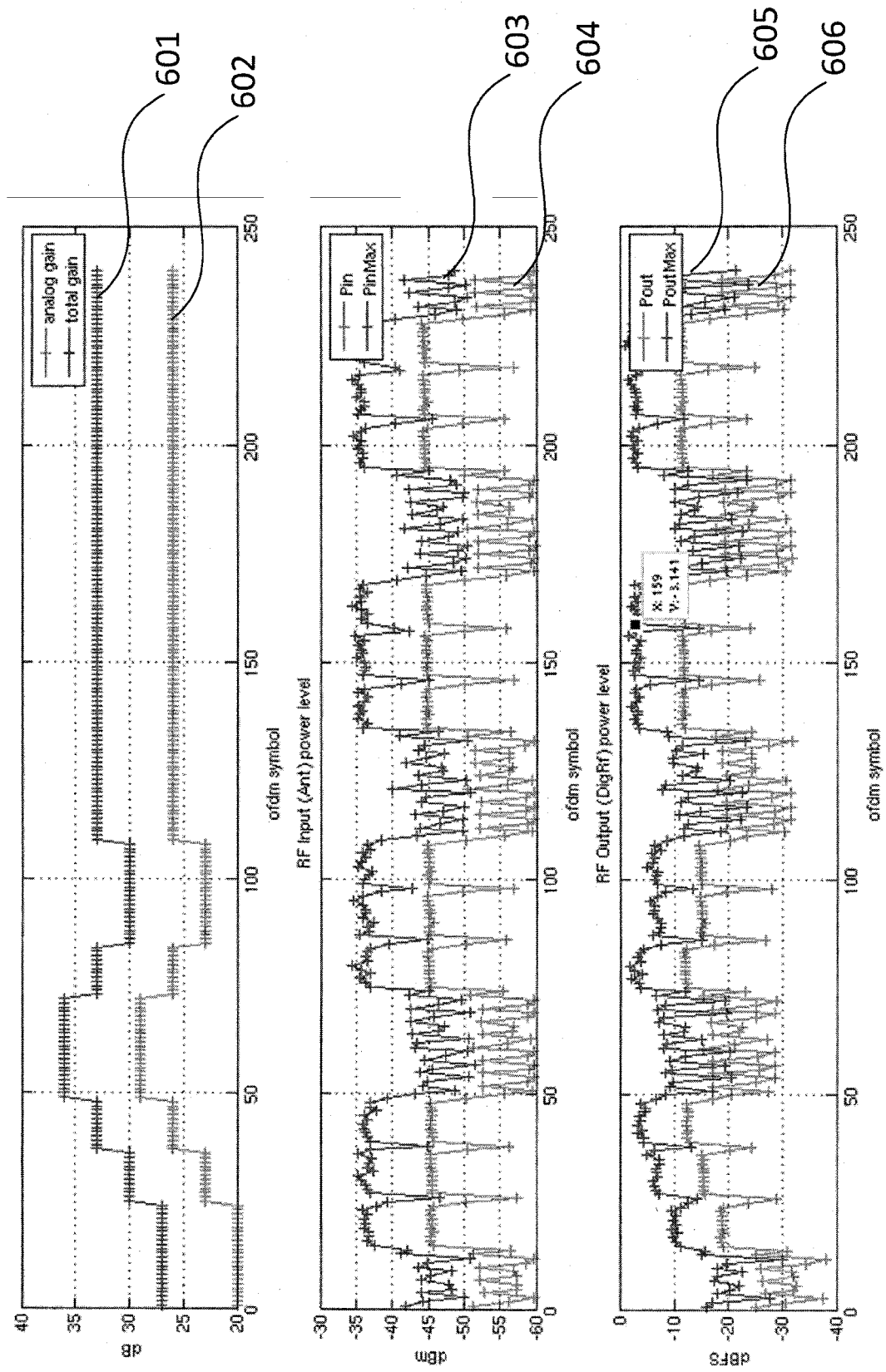
FIG. 6 shows examples of applied gain levels, received signal strength and amplified signal strength.

FIG. 6 shows the result of a simulation of the method 100 (according to test number 3 of TS 36.101 v10.6.0 Release 10, sect. 10.1 (FDD): PMCH 64QAM CR=2/3, 10 MHz BW, MBSFN channel model). In a top portion of FIG. 6 the gain level applied by the amplifier circuit 52 over time is shown. A top plot 601 in the top portion of FIG. 6 states the total gain applied and a bottom plot 602 in the top portion of FIG. 6 states the analog gain applied. In a middle portion of FIG. 6 a signal strength of a received signal (Ant) is shown. A top plot 603 in the middle portion of FIG. 6 depicts a maximum power of the received signal over time. A bottom plot 604 in the middle portion of FIG. 6 depicts a mean power of the received signal over time. In a bottom portion of FIG. 6 a signal strength of an amplified signal (an output of the amplifier circuit) is depicted. A top plot 605 in the bottom portion of FIG. 6 depicts a maximum power of the amplified signal over time. A bottom plot 606 in the bottom portion of FIG. 6 depicts a mean power of the amplified signal over time. The plots 603, 604, 605, 606 show at the beginning of each Multicast-Broadcast Single Frequency Network subframe a dip 607 in signal strength which is caused by the unicast time interval during the Multicast-Broadcast Single Frequency Network subframes, which is mostly empty according to the simulation preset. The unicast subframes in between the multicast subframes also are mostly empty and have therefore a low signal strength.

The following examples pertain to further aspects of this disclosure.

Example 1 is a circuit arrangement, including at least one amplifier circuit configured to amplify a received signal including a first signal received in a first time interval and a second signal received in a second time interval, the second time interval immediately following the first time interval. The first signal and the second signal are signals sent by a different number of coherent wireless signal sources. The circuit arrangement may further include at least one gain control circuit connected to the at least one amplifier circuit and configured to determine a first expected received signal strength of the first signal; to determine a second expected received signal strength of the second signal and to determine a gain level based on the first and second expected received signal strengths. The at least one amplifier circuit is configured to amplify the first signal using the determined gain level and to amplify the second signal using the determined gain level.

In Example 2, the subject matter of Example 1 can optionally include that one of the first or second signals is generated according to a multicast transmission mode and wherein the other of the first or second signal is generated according to a unicast transmission mode.

In Example 3, the subject matter of any of Examples 1 or 2 can optionally include that one of the first or second time interval has a length of 50% or less of the length of the other of the first or second time interval.

In Example 4, the subject matter of any of Examples 1 to 3 can optionally include that the first time interval has a length of 20% or less of the length of the second time interval, the first signal being generated by a unicast transmission mode and the second signal being generated by a multicast transmission mode.

In Example 5, the subject matter of any of Examples 1 to 4 can optionally include that the first and the second time intervals are part of a common subframe according to a wireless communication technology.

In Example 6, the subject matter of Example 5 that the wireless communication technology is a communication technology according to 3rd Generation Partnership Program or Long Term Evolution.

In Example 7, the subject matter of any of Example 6 can optionally include that the subframe is a Multicast-Broadcast Single Frequency Network subframe.

In Example 8, the subject matter of any of Examples 1 to 7 can optionally include that determining the gain level includes: determining a first candidate gain level for the first time interval, determining a second candidate gain level for the second time interval and setting the gain level to the smaller of the first and second candidate gain levels.

In Example 9, the subject matter of Example 8 can optionally include that the determining of at least one of the first and second candidate gain levels includes a subtraction of a backoff gain.

In Example 10, the subject matter of Example 9 can optionally include that the first signal is sent according to a first transmission mode and the second signal is sent according to a second transmission mode, the backoff gain being determined according to a step function of time elapsed since the last time the same respective transmission mode was in effect, the step function increasing over time and having a lower limit of zero and being limited to a maximum backoff.

In Example 11, the subject matter of any of Examples 8 to 10 can optionally include that the determining of one of the first or second candidate gain levels includes the limitation to result in a value higher or equal to the other of the first or second candidate gain levels reduced by a fixed value.

In Example 12, the subject matter of any of Examples 8 to 11 can optionally include that the determining of the gain level includes the limitation to result in a value higher or equal to the higher of the first and second candidate gain levels reduced by a fixed value.

In Example 13, the subject matter of any of Examples 1 to 12 can optionally include that the gain control circuit is configured to determine gain reference values for different transmission modes during time intervals in which the respective transmission mode is in effect and save these gain reference values together with a time stamp.

In Example 14, the subject matter of Example 13 can optionally include that the first and the second time intervals are part of a same Multicast-Broadcast Single Frequency Network subframe according to a wireless transmission protocol and that the gain control circuit is configured to save gain reference values for each encountered Multicast-Broadcast Single Frequency Network region separately.

In Example 15, the subject matter of any of Examples 13 and 14 can optionally include that the first signal is sent according to a first transmission mode and the second signal is sent according to a second transmission mode. Determining the gain level may include: determining a first candidate gain level for the first time interval on basis of the saved reference value for the first transmission mode, determining a second candidate gain level for the second time interval on basis of the saved reference values for the second transmission mode, and setting the gain level to the smaller of the first and second candidate gain level.

Example 16 is a mobile device including a circuit arrangement and an antenna configured to receive a signal and being connected to the circuit arrangement, the circuit arrangement including: at least one amplifier circuit configured to amplify the received signal including a first signal received in a first time interval and a second signal received in a second time interval. The first signal and the second signal are signals sent by a different number of coherent wireless signal sources. The circuit arrangement may further include at least one gain control circuit connected to the at least one amplifier circuit and configured to determine a first expected received signal strength of the first signal, to determine a second expected received signal strength of the second signal, and to determine a gain level based on the first and second expected received signal strengths. The at least one amplifier circuit is configured to amplify the first signal using the determined gain level and to amplify the second signal using the determined gain level.

In Example 17, the subject matter of Example 16 can optionally include that one of the first or second signals is generated according to a multicast transmission mode and the other of the first or second signal is generated according to a unicast transmission mode.

In Example 18, the subject matter of any of Example 16 and 17 can optionally include that one of the first or second time interval has a length of 50% or less of the length of the other of the first or second time interval.

In Example 19, the subject matter of any of Examples 16 to 18 can optionally include that the first time interval has a length of 20% or less of the length of the second time interval, the first signal being generated by a unicast transmission mode and the second signal being generated by a multicast transmission mode.

In Example 20, the subject matter of any of Examples 16 to 19 can optionally include that the first and the second time intervals are part of a common subframe according to a wireless communication technology.

In Example 21, the subject matter of Example 20 can optionally include that the wireless communication technology is a communication technology according to 3rd Generation Partnership Program or Long Term Evolution.

In Example 22, the subject matter of Example 21 can optionally include that the subframe is a Multicast-Broadcast Single Frequency Network subframe.

In Example 23, the subject matter of any of Examples 16 to 22 can optionally include that determining the gain level includes: determining a first candidate gain level for the first time interval, determining a second candidate gain level for the second time interval, and setting the gain level to the smaller of the first and second candidate gain levels.

In Example 24, the subject matter of Example 23 can optionally include that the determining of at least one of the first and second candidate gain levels includes a subtraction of a backoff gain.

In Example 25, the subject matter of Example 24 can optionally include that the first signal is sent according to a first transmission mode and the second signal is sent according to a second transmission mode, the backoff gain being determined according to a step function of time elapsed since the last time the same respective transmission mode was in effect, the step function increasing over time and having a lower limit of zero and being limited to a maximum backoff.

In Example 26, the subject matter of any of Examples 23 to 25 can optionally include that the determining of one of the first or second candidate gain levels includes the limitation to result in a value higher or equal to the other of the first or second candidate gain levels reduced by a fixed value.

In Example 27, the subject matter of any of Examples 23 to 26 can optionally include that the determining of the gain level includes the limitation to result in a value higher or equal to the higher of the first and second candidate gain levels reduced by a fixed value.

In Example 28, the subject matter of any of Examples 16 to 27 can optionally include that the gain control circuit is configured to determine gain reference values for different transmission modes during time intervals in which the respective transmission mode is in effect and save these gain reference values together with a time stamp.

In Example 29, the subject matter of Example 28 can optionally include that the first and the second time intervals are part of a same Multicast-Broadcast Single Frequency Network subframe according to a wireless transmission protocol and wherein the gain control circuit is configured to save gain reference values for each encountered Multicast-Broadcast Single Frequency Network region separately.

In Example 30, the subject matter of any of Examples 28 to 29 can optionally include that the first signal is sent according to a first transmission mode and the second signal is sent according to a second transmission mode. Determining the gain level may include: determining a first candidate gain level for the first time interval on basis of the saved reference value for the first transmission mode, determining a second candidate gain level for the second time interval on basis of the stored reference values for the second transmission mode, and setting the gain level to the smaller of the first and second candidate gain level.

Example 31 is a method for amplifying a received signal including of a first signal received in a first time interval and a second signal received in a second time interval, the second time interval immediately following the first time interval. The first signal and the second signal are signals sent by a different number of coherent wireless signal sources. The method may include: determining a first expected received signal strength of the first signal, determining a second expected received signal strength of the second signal, determining a gain level based on the first and second expected received signal strengths, amplifying the first signal using the determined gain level, and amplifying the second signal using the determined gain level.

In Example 32, the subject matter of Example 31 can optionally include that one of the first or second signals is generated according to a multicast transmission mode and wherein the other of the first or second signal is generated according to a unicast transmission mode.

In Example 33, the subject matter of any of Examples 31 and 32 can optionally include one of the first or second time interval has a length of 50% or less of the length of the other of the first or second time interval.

In Example 34, the subject matter of any of Examples 31 to 33 can optionally include that the first time interval has a length of 20% or less of the length of the second time interval, the first signal being generated by a unicast transmission mode and the second signal being generated by a multicast transmission mode.

In Example 35, the subject matter of any of Examples 31 to 34 can optionally include that wherein the first and the second time intervals are part of a common subframe according to a wireless communication technology.

In Example 36, the subject matter of Example 35 can optionally include that the wireless communication technology is a communication technology according to 3rd Generation Partnership Program or Long Term Evolution.

In Example 37, the subject matter of Example 36 can optionally include that the subframe is a Multicast-Broadcast Single Frequency Network subframe.

In Example 38, the subject matter of any of Examples 31 to 37 can optionally include that determining the gain level includes: determining a first candidate gain level for the first time interval, determining a second candidate gain level for the second time interval; setting the gain level to the smaller of the first and second candidate gain levels.

In Example 39, the subject matter of any of Examples 31 to 38 can optionally include that the determining of at least one of the first and second candidate gain levels includes a subtraction of a backoff gain.

In Example 40, the subject matter of Example 39 can optionally include that the first signal is sent according to a first transmission mode and the second signal is sent according to a second transmission mode, the backoff gain being determined according to a step function of time elapsed since the last time the same respective transmission mode was in effect, the step function increasing over time and having a lower limit of zero and being limited to a maximum backoff.

In Example 41, the subject matter of any of Examples 38 to 40 can optionally include that the determining of one of the first or second candidate gain levels includes the limitation to result in a value higher or equal to the other of the first or second candidate gain levels reduced by a fixed value.

In Example 42, the subject matter of any of Examples 38 to 41 can optionally include that the determining of the gain level includes the limitation to result in a value higher or equal to the higher of the first and second candidate gain levels reduced by a fixed value.

In Example 43, the subject matter of any of Examples 31 to 42 can optionally include that gain reference values for different transmission modes are determined during time intervals in which the respective transmission mode is in effect and wherein these gain reference values are saved together with a time stamp.

In Example 44, the subject matter of Example 43 can optionally include that the first and the second time intervals are part of a same Multicast-Broadcast Single Frequency Network subframe according to a wireless transmission protocol and that the gain control circuit is configured to save gain reference values for each encountered Multicast-Broadcast Single Frequency Network region separately.

In Example 45, the subject matter of any of Examples 43 and 44 can optionally include that the first signal is sent according to a first transmission mode and the second signal is sent according to a second transmission mode. Determining the gain level may include: determining a first candidate gain level for the first time interval on basis of the stored reference value for the first transmission mode, determining a second candidate gain level for the second time interval on basis of the saved reference values for the second transmission mode, setting the gain level to the smaller of the first and second candidate gain level.

Example 46 is a circuit arrangement, including: at least one amplifier circuit configured to amplify a received signal including a unicast signal having a single coherent signal source and received in a first partial subframe and a multicast signal having multiple coherent signal sources and received in a second partial subframe, the second partial subframe immediately following the first partial subframe, and at least one gain control circuit configured to determine a first expected signal strength of the unicast signal, to determine a second expected signal strength of the multicast signal, to select a gain level based on the first expected signal strength and the second expected signal strength, to control the at least one amplifier circuit to amplify the unicast signal and the multicast signal using the selected gain level.

In Example 47, the subject matter of Example 46 can optionally include that the first partial subframe has a length of 20% or less of the length of the second partial subframe.

In Example 48, the subject matter of any of Examples 46 and 47 can optionally include that the first partial subframe and the second partial subframe together form a Long Term Evolution subframe.

In Example 49, the subject matter of any of Examples 46 to 48 can optionally include that determining the gain level includes: determining a first candidate gain level for the first partial subframe; determining a second candidate gain level for the second partial subframe; and setting the gain level to the smaller of the first and second candidate gain levels.

In Example 50, the subject matter of Example 49 can optionally include that determining the second candidate gain levels includes a subtraction of a backoff gain.

In Example 51, the subject matter of Example 50 can optionally include that the backoff gain is determined according to a step function of time elapsed since the last time a multicast signal from the same multicast region was received, the step function increasing over time and having a lower limit of zero and being limited to a maximum backoff.

In Example 52, the subject matter of any of Examples 49 to 51 can optionally include that the determining of the second candidate gain level includes the limitation to result in a value higher or equal to the first candidate gain level reduced by a fixed value.

In Example 53, the subject matter of any of Examples 49 to 52 can optionally include that the selecting of the gain level includes the limitation to result in a value higher or equal to the higher of the first and second candidate gain levels reduced by a fixed value.

In Example 54, the subject matter of any of examples 46 to 53 can optionally include that the gain control circuit is configured to determine gain reference values for different transmission modes during time intervals in which the respective transmission mode is in effect and save these gain reference values together with a time stamp.

In Example 55, the subject matter of Example 54 can optionally include that the gain control circuit is configured to save gain reference values for each encountered multicast region separately.

In Example 56, the subject matter of any of Examples 54 and 55 can optionally include that determining the gain level includes: determining a first candidate gain level for the unicast signal on basis of the saved reference value for the unicast transmission mode, determining a second candidate gain level for the multicast signal on basis of the saved reference value for the multicast transmission mode, and setting the gain level to the smaller of the first and second candidate gain level.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement, comprising:
    at least one amplifier circuit configured to amplify a received signal comprising a first signal received in a first time interval and a second signal received in a second time interval, wherein the first signal or the second signal is sent by one coherent wireless signal source and the other of the first or the second signal is sent by at least two coherent wireless signal sources; and
    at least one gain control circuit connected to the at least one amplifier circuit and configured to
        determine a first expected received signal strength of the first signal;
        determine a second expected received signal strength of the second signal;
        determine a gain level based on the first and second expected received signal strengths;
    wherein the at least one amplifier circuit is configured to amplify the first signal using the determined gain level and to amplify the second signal using the determined gain level.

2. The circuit arrangement of claim 1,
wherein one of the first or second signals is generated according to a multicast transmission mode and wherein the other of the first or second signal is generated according to a unicast transmission mode.

3. The circuit arrangement of claim 1,
wherein one of the first or second time interval has a length of 50% or less of the length of the other of the first or second time interval.

4. The circuit arrangement of claim 1,
wherein the first time interval has a length of 20% or less of the length of the second time interval, the first signal being generated by a unicast transmission mode and the second signal being generated by a multicast transmission mode.

5. The circuit arrangement of claim 1,
wherein the first and the second time intervals are part of a common subframe according to a wireless communication technology.

6. The circuit arrangement of claim 5,
wherein the wireless communication technology is a communication technology according to 3rd Generation Partnership Program or Long Term Evolution.

7. The circuit arrangement of claim 6,
wherein the subframe is a Multicast-Broadcast Single Frequency Network subframe.

8. The circuit arrangement of claim 1,
wherein determining the gain level comprises:
    determining a first candidate gain level for the first time interval;
    determining a second candidate gain level for the second time interval;
    setting the gain level to the smaller of the first and second candidate gain levels.

9. The circuit arrangement of claim 8,
wherein determining of at least one of the first and second candidate gain levels includes a subtraction of a backoff gain.

10. The circuit arrangement of claim 9,
wherein the first signal is sent according to a first transmission mode and the second signal is sent according to a second transmission mode, the backoff gain being determined according to a step function of time elapsed since the last time the same respective transmission mode was in effect, the step function increasing over time and having a lower limit of zero and being limited to a maximum backoff.

11. The circuit arrangement of claim 8,
wherein the determining of one of the first or second candidate gain levels includes the limitation to result in a value higher or equal to the other of the first or second candidate gain levels reduced by a fixed value.

12. The circuit arrangement of claim 1,
wherein the gain control circuit is configured to determine gain reference values for different transmission modes during time intervals in which the respective transmission mode is in effect and save these gain reference values together with a time stamp.

13. The circuit arrangement of claim 12,
wherein the first and the second time intervals are part of a same Multicast-Broadcast Single Frequency Network subframe according to a wireless transmission protocol; and
wherein the gain control circuit is configured to save gain reference values for each encountered Multicast-Broadcast Single Frequency Network region separately.

14. The circuit arrangement of claim 12,
wherein the first signal is sent according to a first transmission mode and the second signal is sent according to a second transmission mode;
wherein determining the gain level comprises:
determining a first candidate gain level for the first time interval on basis of the saved reference value for the first transmission mode;
determining a second candidate gain level for the second time interval on basis of the saved reference values for the second transmission mode;
setting the gain level to the smaller of the first and second candidate gain level.

15. A mobile device comprising a circuit arrangement and an antenna configured to receive a signal and being connected to the circuit arrangement, the circuit arrangement comprising:
at least one amplifier circuit configured to amplify the received signal comprising a first signal received in a first time interval and a second signal received in a second time interval, wherein the first or the second signal is sent by one coherent wireless signal source and the other of the first or the second signal is sent by at least two coherent wireless signal sources; and
at least one gain control circuit connected to the at least one amplifier circuit and configured to
determine a first expected received signal strength of the first signal;
determine a second expected received signal strength of the second signal;
determine a gain level based on the first and second expected received signal strengths;
wherein the at least one amplifier circuit is configured to amplify the first signal using the determined gain level and to amplify the second signal using the determined gain level.

16. A method for amplifying a received signal comprising of a first signal received in a first time interval and a second signal received in a second time interval, wherein the first signal or the second signal is sent by one coherent wireless signal source and the other of the first or the second signal is sent by at least two coherent wireless signal sources, the method comprising:
determining a first expected received signal strength of the first signal;
determining a second expected received signal strength of the second signal;
determining a gain level based on the first and second expected received signal strengths;
amplifying the first signal using the determined gain level; and
amplifying the second signal using the determined gain level.

17. The method of claim 16,
wherein determining the gain level comprises:
determining a first candidate gain level for the first time interval;
determining a second candidate gain level for the second time interval;
setting the gain level to the smaller of the first and second candidate gain levels.

18. The method of claim 17,
wherein the determining of at least one of the first and second candidate gain levels includes a subtraction of a backoff gain.

19. The method of claim 18,
wherein the first signal is sent according to a first transmission mode and the second signal is sent according to a second transmission mode, the backoff gain being determined according to a step function of time elapsed since the last time the same respective transmission mode was in effect, the step function increasing over time and having a lower limit of zero and being limited to a maximum backoff.

20. The method of claim 17,
wherein the determining of one of the first or second candidate gain levels includes the limitation to result in a value higher or equal to the other of the first or second candidate gain levels reduced by a fixed value.

21. A circuit arrangement, comprising:
at least one amplifier circuit configured to amplify a received signal comprising a unicast signal having a single coherent signal source and received in a first partial subframe and a multicast signal having multiple coherent signal sources and received in a second partial subframe, the second partial subframe immediately following the first partial subframe; and
at least one gain control circuit configured to
determine a first expected signal strength of the unicast signal;
determine a second expected signal strength of the multicast signal;
select a gain level based on the first expected signal strength and the second expected signal strength;
control the at least one amplifier circuit to amplify the unicast signal and the multicast signal using the selected gain level.

* * * * *